(12) United States Patent
Lam

(10) Patent No.: US 12,470,184 B2
(45) Date of Patent: Nov. 11, 2025

(54) MULTI-MODE POWER AMPLIFIER SIGNAL SWITCHING

(71) Applicant: SKYWORKS SOLUTIONS, INC., Irvine, CA (US)

(72) Inventor: Lui Ray Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 588 days.

(21) Appl. No.: 17/709,795

(22) Filed: Mar. 31, 2022

(65) Prior Publication Data
US 2022/0321069 A1    Oct. 6, 2022

Related U.S. Application Data

(60) Provisional application No. 63/169,037, filed on Mar. 31, 2021.

(51) Int. Cl.
| | | |
|---|---|---|
| H03F 1/14 | (2006.01) | |
| H03F 3/195 | (2006.01) | |
| H03F 3/24 | (2006.01) | |
| H03F 3/72 | (2006.01) | |

(52) U.S. Cl.
CPC .............. *H03F 3/245* (2013.01); *H03F 3/195* (2013.01); *H03F 3/72* (2013.01); *H03F 2200/318* (2013.01); *H03F 2200/451* (2013.01); *H03F 2200/537* (2013.01); *H03F 2200/541* (2013.01); *H03F 2203/7221* (2013.01)

(58) Field of Classification Search
CPC . H03F 3/245; H03F 3/195; H03F 3/72; H03F 2200/318; H03F 2200/451; H03F 2200/537; H03F 2203/7221; H03F 1/50; H03F 1/08; H03F 1/565; H03F 3/68; H03H 7/0161; H01F 19/04; H01F 19/02; H01F 19/00
USPC ........................................ 330/117, 301, 302
See application file for complete search history.

(56) References Cited

U.S. PATENT DOCUMENTS

| | | | | |
|---|---|---|---|---|
| 7,869,771 | B2 * | 1/2011 | Zolfaghari | H04B 1/0067 455/248.1 |
| 8,280,325 | B2 * | 10/2012 | Zolfaghari | H04B 1/0067 330/171 |
| 9,160,377 | B2 * | 10/2015 | Lee | H03F 3/72 |
| 9,184,707 | B2 * | 11/2015 | Rangarajan | H03G 1/0029 |
| 10,110,184 | B2 * | 10/2018 | Lyalin | H03G 11/004 |
| 10,574,286 | B2 * | 2/2020 | Wang | H03F 3/193 |
| 12,003,221 | B2 * | 6/2024 | Cao | H03F 3/72 |
| 2011/0171994 | A1 * | 7/2011 | Rajendran | H04B 1/006 455/552.1 |

* cited by examiner

*Primary Examiner* — Khanh V Nguyen
(74) *Attorney, Agent, or Firm* — Chang & Hale LLP

(57) ABSTRACT

A switching circuit comprises a first transistor, a transformer including a first inductor and a second inductor that is co-centric with the first inductor, a first switch, a second switch, a second transistor, a first output, a second output, and coupling circuitry configured to couple the first inductor to the first transistor, a first end of the second inductor, the first switch, and the first output together at a first node, a second end of the second inductor, the second switch, and the second transistor together at a second node, and the second output to the second transistor.

18 Claims, 4 Drawing Sheets

020
MULTI-MODE POWER AMPLIFIER SIGNAL SWITCHING

CROSS-REFERENCE TO RELATED APPLICATION

This application claims priority to U.S. Provisional Application No. 63/169,037 filed Mar. 31, 2021, entitled MULTI-MODE POWER AMPLIFIER SIGNAL SWITCHING, the disclosure of which is hereby expressly incorporated by reference herein in its respective entirety.

BACKGROUND

Field

The present disclosure relates to switching circuits, related devices, and related methods for radio-frequency (RF) applications.

Description of the Related Art

Multi-mode (e.g., dual-path) power amplifiers are becoming increasingly important, particularly for higher levels of integration and/or wider operating ranges. For example, 802.11ax, 802.11be (i.e., Wi-Fi 7), and/or other high-efficiency and/or high-performing communication systems can utilize multi-mode power amplifiers.

SUMMARY

In accordance with some implementations, the present disclosure relates to a switching circuit comprising a first transistor, a transformer including a first inductor and a second inductor that is co-centric with the first inductor, a first switch, a second switch, a second transistor, a first output, a second output, and coupling circuitry configured to couple the first inductor to the first transistor, a first end of the second inductor, the first switch, and the first output together at a first node, a second end of the second inductor, the second switch, and the second transistor together at a second node, and the second output to the second transistor.

The coupling circuitry may be further configured to couple the first inductor to a source of the first transistor. In some embodiments, the first switch is a shunt switch.

In some embodiments, the second switch is a shunt switch. The switching may further comprise a matching network. In some embodiments, the coupling circuitry is further configured to couple the matching network between the first output and the first node.

The switching circuit may further comprise a matching network. In some embodiments, the coupling circuitry is further configured to couple the matching network between the second output and the second transistor.

In some embodiments, the coupling circuitry is further configured to couple the matching network to a source of the second transistor. The first transistor may be a second-stage amplifier.

The second transistor may be a third-stage amplifier. In some embodiments, the switching circuit further comprises an inter-stage network. The coupling circuitry may be further configured to couple the inter-stage network between the second transistor and the second node.

In some embodiments, the first switch is configured to be biased to an OFF state to direct a signal to the second output. The second switch may be configured to be biased to an OFF state to direct a signal to the first output.

The first output may be a low-gain output. In some embodiments, the second output is a high-gain output.

Some implementations of the present disclosure relate to a semiconductor die comprising a first transistor, a transformer comprising a first inductor and a second inductor that is co-centric with the first inductor, a first switch, a second switch, a second transistor, a first output, a second output, and coupling circuitry configured to couple the first inductor to the first transistor, a first end of the second inductor, the first switch, and the first output together at a first node, a second end of the second inductor, the second switch, and the second transistor together at a second node, and the second output to the second transistor.

In some embodiments, the coupling circuitry is further configured to couple the first inductor to a source of the first transistor. The semiconductor die may further comprise a matching network. In some embodiments, the coupling circuitry is further configured to couple the matching network between the first output and the first node.

The semiconductor die may further comprise a matching network. In some embodiments, the coupling circuitry is further configured to couple the matching network between the second output and the second transistor.

In accordance with some implementations of the present disclosure, a packaged module comprises a first transistor, a transformer comprising a first inductor and a second inductor that is co-centric with the first inductor, a first switch, a second switch, a second transistor, a first output, a second output, and coupling circuitry configured to couple the first inductor to the first transistor, a first end of the second inductor, the first switch, and the first output together at a first node, a second end of the second inductor, the second switch, and the second transistor together at a second node, and the second output to the second transistor.

The packaged module may further comprise a matching network, The coupling circuitry may be further configured to couple the matching network between the first output and the first node.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

Figure 1:
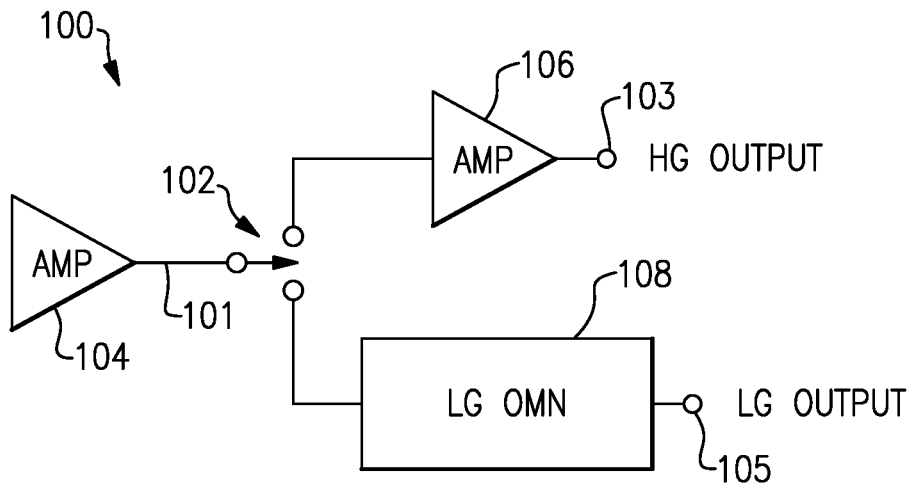
FIG. 1 illustrates an example switching circuit 100 including a series switch.

The headings provided herein, if any, are for convenience only and do not necessarily affect the scope or meaning of the claimed invention.

Multi-mode (e.g., dual-path) power amplifiers are becoming increasingly important, particularly for higher levels of integration and/or wider operating ranges. For example, 802.11ax, 802.11 be (i.e., Wi-Fi 7), and/or other high-efficiency and/or high-performing communication systems can utilize multi-mode power amplifiers.

As communication systems become more complex, there can be more modes available for power amplifiers to operate in. Power amplifiers can operate in multiple bands and/or power levels. Some electronic devices (e.g., cell phones) can be capable of wide-range transmissions.

Selection of operation modes can be determined based on a variety of factors, including distance between communicating devices. For example, a first network access device (e.g., a cell phone) and a second network access device may simultaneously receive signals from a router. If the first network access device is situated further from the router than the second network access device, signals received at the first network access device from the router may be weaker than signals received at the second network access device from the router. As a result, a higher power level may be used in transmission between the router and the first network access device and/or a lower power level may be used in transmission between the router and the second network access device. For example, the first network access device may utilize a high power mode to communicate with the router and/or the second network access device may utilize a low power mode to communicate with the router. Based at least in part on the positioning differences of the first network access device and the second network access device with respect to the router, both network access devices, while operating at different power levels, may be in approximately the same power/frequency range from the perspective of the router.

Described herein are switching circuits configured to enable electronic devices to effectively switch between high-gain and low-gain modes. In some embodiments, a high-gain path may comprise an additional amplifier and/or other additional components with respect to the low-gain path. The switching circuit may comprise a matching network to effectively back off of a first amplifier to a second amplifier to reduce power. By utilizing a low-gain path, amplifiers associated with the high-gain path may not be used when low-gain is sufficient, thereby saving power.

Embodiments described herein can be applicable to various types of networks, which can include Bluetooth and Wi-Fi, among many others. Bluetooth transmitting/receiving power may generally be lower than Wi-Fi power because devices communicating via Bluetooth may generally be situated closer together than devices communicating via Wi-Fi. Amplifiers (e.g., transistors) described herein may be used for multiple types of networks. In some embodiments, different signal paths may be used for communication standards using different frequencies and/or for different power levels using the same communication standard.

When output power needs to be changed by a relatively large amount between modes, a full switch may be needed to divert the signal path. For example, when the required output power increases beyond the capabilities of a first amplifier, a full switch may be used to switch the signal to an output path including a second amplifier. If the first amplifier is sufficient to drive the required power level, the second amplifier may not be needed and the low-gain path (which may not include additional amplifiers) may be used. For lower frequencies, power reduction at the low-gain path (i.e., power difference between the low-gain path and the high-gain path) can be approximately 15 dB. However, for some frequencies, power reduction of approximately 10 dB may be sufficient.

A full switch may be configured to divert signals between two signal paths. A signal may be passed through a switch which can control which signal path the signal moves through. To avoid signal distortion, low insertion loss and/or high isolation may be needed between the multiple signal paths. The switch may be configured to move with the signal swing. Ideally, the switch may be configured to pass through a signal swing without distorting and/or generating non-linearity.

Embodiments described herein relate to switching circuits for amplifiers (e.g., power amplifiers) in which signals from a first input are selectively passed to a first output or a second output. To control the signal to the first output, one or more switches coupled to and/or associated with the first output may be biased to an ON state and/or one or more switches coupled to and/or associated with the second output may be biased to an OFF state. Example switching circuits described herein can include Single Pole Double Throw (SPDT) switches. For example, the first output can be coupled between a first series switch and a first shunt switch and/or the second output can be coupled between a second series switch and a second shunt switch. The various switches can be configured to pass radio frequency swing through such that a voltage of the switching circuit moves together with the radio frequency swing. To control a signal path to a first output, it can be important to isolate the second output (e.g., by biasing one or more switches associated with the second output to an OFF state) to prevent the second output from activating and/or generating harmonics.

Some methods of isolating a high-gain output from a low-gain output involve use of a series switch. FIG. 1 illustrates an example switching circuit 100 including a series switch 102. A first amplifier 104 (e.g., transistor) may be coupled at an input 101 path of the switching circuit 100. In other words, the first amplifier 104 may be utilized for both a high-gain output 103 path and a low-gain output 105 path. The high-gain output 103 path may comprise a second amplifier 106 (e.g., transistor) configured to increase power levels of the switching circuit 100. The low-gain output 105 path may comprise an output matching network (OMN) 108 configured to isolate the low-gain output 105 path from the second amplifier 106 at the high-gain output 103 path.

It can be difficult for a linear series switch 102 to provide relatively low loss. In some cases, shunt switches may be used to provide low loss to a switching circuit 100. Some embodiments described herein can advantageously provide relatively high linearity without requiring a series switch. In some embodiments, one or more transformers may be used to support linearity of switching circuits. Transformers described herein may be configured to provide approximately 25 Ohms of resistance.

The various switching circuits described herein can be configured to provide more output power and/or gain in low-gain and/or high-gain modes relative to other switching circuits. Moreover, the switching circuits described herein may be comparable or smaller in size relative to other switching circuits.

Figure 2:
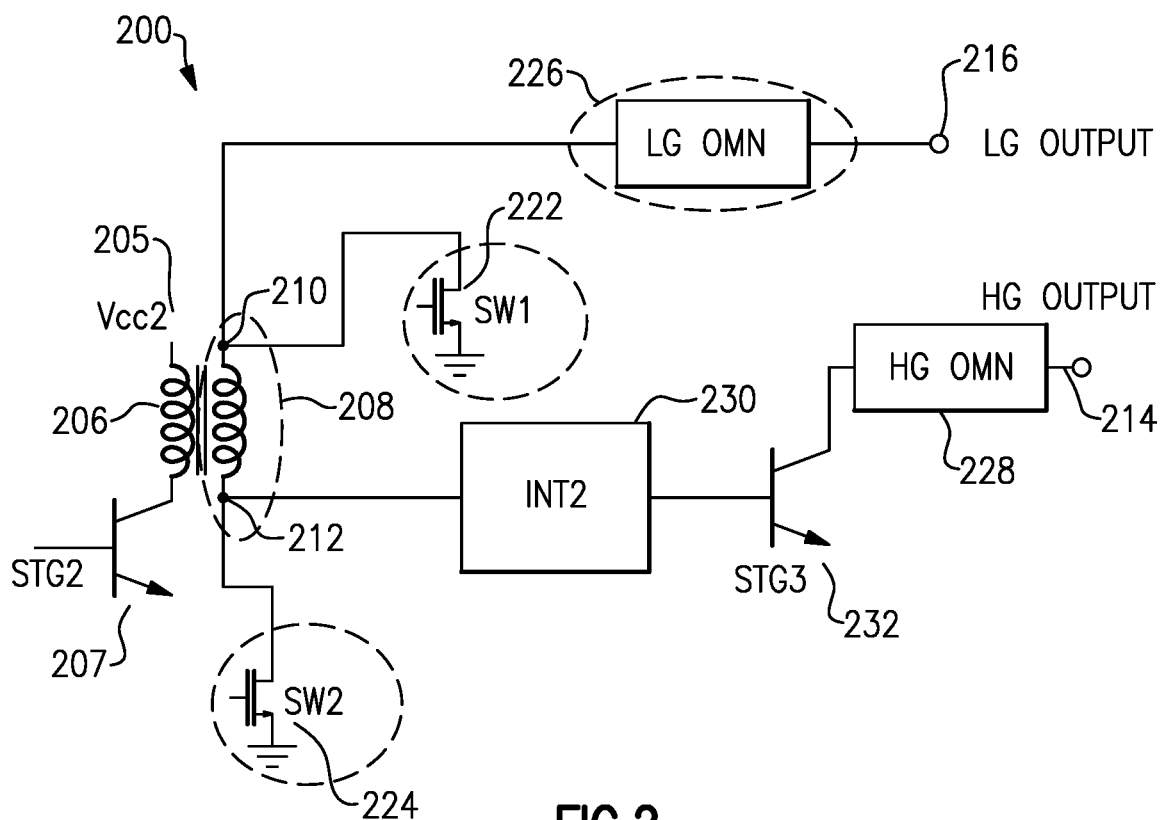
FIG. 2 illustrates an example switching circuit comprising a transformer in accordance with one or more embodiments.

FIG. 2 illustrates an example switching circuit 200 comprising a transformer 205 in accordance with one or more embodiments. Coupling circuitry may be configured to couple the various components of FIG. 2 and/or other Figures together and/or to various nodes, as described herein. The transformer 205 may comprise a first wind inductor 206 (e.g., a primary inductor) and/or a second wind inductor 208 (e.g., a secondary inductor). The first inductor 206 and the second inductor 208 may be co-centric. The first wind inductor 206 may be a component of a second amplification stage of the circuit 200 and/or may be coupled (e.g., via coupling circuitry) to a transistor/amplifier 207 (e.g., coupled to a source of the transistor 207).

The second inductor 208 may be coupled between a first node 210 and a second node 212. The first node 210 may be associated with a low-gain output 216 and/or the second node 212 may be associated with a high-gain output 214. In some embodiments, the first node 210 may be coupled to a first switch 222 and/or the second node 212 may be coupled to a second switch 224. The first node 210 may further be coupled to a first matching network 226, which may be coupled to the low-gain output 216. The second node 212 may be coupled to a second matching network 228, which may be coupled to the high-gain output 214. In some embodiments, the second node 212 may be coupled to an inter-stage 230 network, which may be coupled between the second node 212 and a third-stage transistor/amplifier 232. The high-gain output 214 may be coupled to the third-stage transistor 232 (e.g., to a source of the transistor 232).

In some embodiments, the first switch 222 and/or the second switch 224 may comprise shunt switches. The first switch 222 and/or second switch 224 may have any suitable size and/or may be configured to pull one of the first node 210 and/or the second node 212 to ground to direct a signal path through the circuit 200. For example, to direct a signal to the low-gain output 216, the first switch 222 may be biased with a 0V voltage and/or may pull the first node 210 to ground. To direct a signal to the high-gain output 214, the second switch 224 may be biased with a 0V voltage and/or may pull the second node 212 to ground.

The first switch 222 and/or the second switch 224 may advantageously be configured to isolate the high-gain output 214 from the low-gain output 216. The circuit 200 may be configured to generate only a minimal amount of non-linearity based at least in part on isolation created by the first switch and/or the second switch 224.

Figure 3:
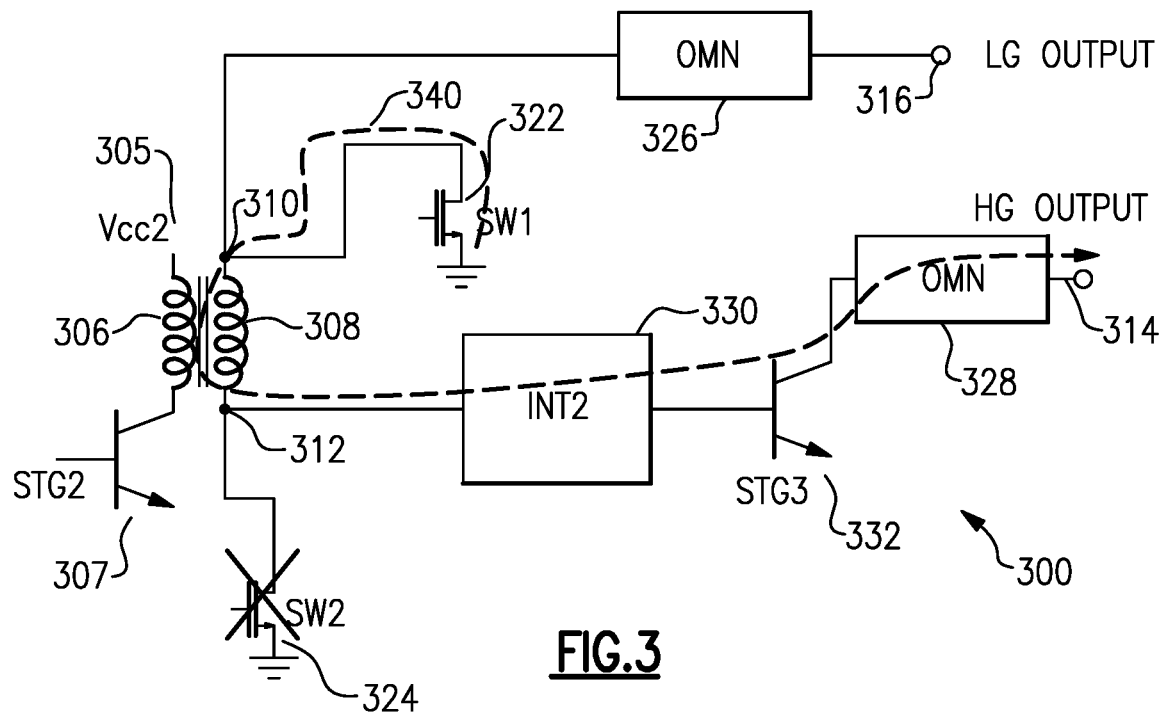
FIG. 3 illustrates a signal path through an example switching circuit in accordance with one or more embodiments.

FIG. 3 illustrates a signal path 340 through an example switching circuit 300 in accordance with one or more embodiments. The circuit 300 can include a transformer 305 that may comprise a first wind inductor 306 and/or a second wind inductor 308. The first inductor 306 and the second inductor 308 may be co-centric. The first wind inductor 306 may be a component of a second amplification stage of the circuit 300 and/or may be coupled to a second-stage transistor/amplifier 307 (e.g., coupled to a source of the transistor 307).

The second inductor 308 may be coupled between a first node 310 and a second node 312. The first node 310 may be associated with a low-gain output 316 and/or the second node 312 may be associated with a high-gain output 314. In some embodiments, the first node 310 may be coupled to a first switch 322 and/or the second node 312 may be coupled to a second switch 324. The first node 310 may further be coupled to a first matching network 326, which may be coupled to the low-gain output 316. The second node 312 may be coupled to a second matching network 328, which may be coupled to the high-gain output 314. In some embodiments, the second node 312 may be coupled to an inter-stage 330 network, which may be coupled between the second node 312 and a third-stage transistor 332. The high-gain output 314 may be coupled to the third-stage transistor 332 (e.g., to a source of the transistor 332).

In some embodiments, a signal may be configured to travel from the first switch 322, through the transformer 305, through the inter-stage 330 network, through the third-stage transistor 332, through the second matching network 328, and/or to the high-gain output 314, as indicated by the signal path 340. To direct the signal along the signal path 340, the first switch 322, which may be associated with the low-gain output 316, may be biased to an ON state (e.g., 2.5V or 5V) and/or the second switch 324, which may be associated with the high-gain output 314, may be biased to an OFF state (e.g., 0V).

The first switch 322 may be configured to pull one side of the second inductor 308 (e.g., the first node 310) to ground. Moreover, the first switch may be configured to isolate the first matching network 326 from the inter-stage 330 network. The second switch 324 may be configured to be biased to an OFF state. The inter-stage 330 network can include various components related to circuit amplification.

Figure 4:
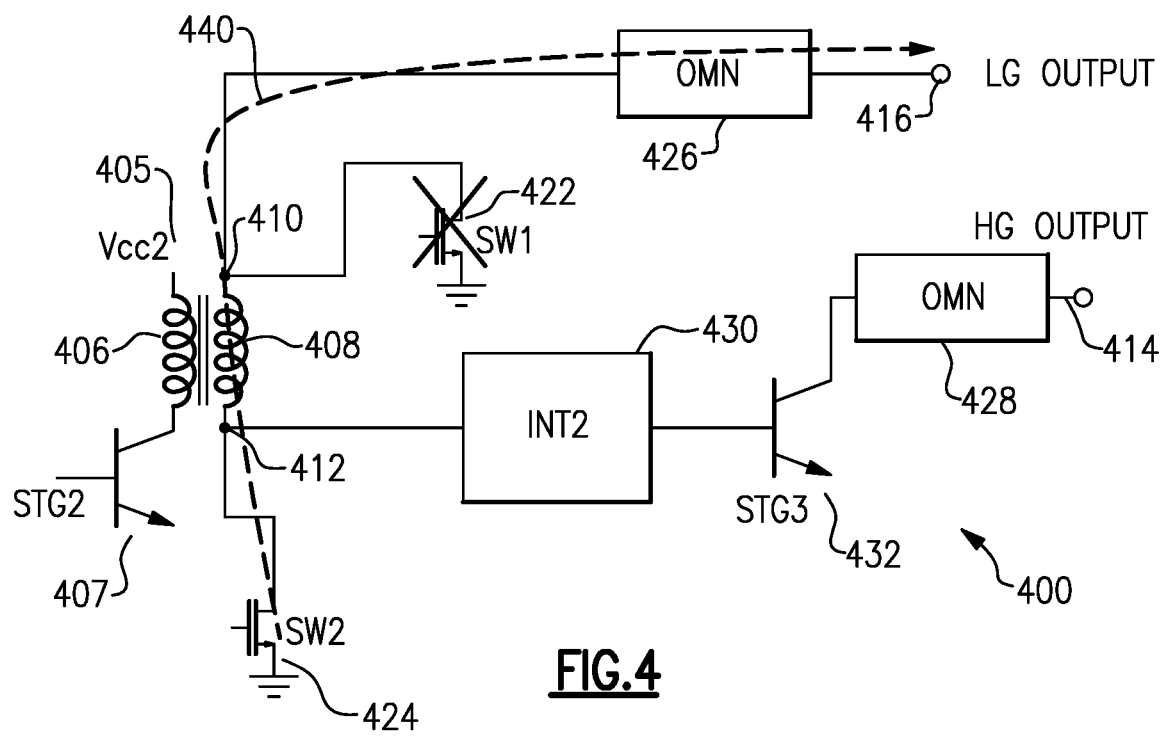
FIG. 4 illustrates a signal path through an example switching circuit in accordance with one or more embodiments.

FIG. 4 illustrates a signal path through an example switching circuit 400 in accordance with one or more embodiments. The circuit 400 can include a transformer 405 that may comprise a first wind inductor 406 and/or a second wind inductor 408. The first inductor 406 and the second inductor 408 may be co-centric. The first wind inductor 406 may be a component of a second amplification stage of the circuit 400 and/or may be coupled to a transistor 407 (e.g., coupled to a source of the transistor 407).

The second inductor 408 may be coupled between a first node 410 and a second node 412. The first node 410 may be associated with a low-gain output 416 and/or the second node 412 may be associated with a high-gain output 414. In some embodiments, the first node 410 may be coupled to a first switch 422 and/or the second node 412 may be coupled to a second switch 424. The first node 410 may further be coupled to a first matching network 426, which may be coupled to the low-gain output 416. The second node 412 may be coupled to a second matching network 428, which may be coupled to the high-gain output 414. In some embodiments, the second node 412 may be coupled to an inter-stage 430 network, which may be coupled between the second node 412 and a third-stage transistor 432. The high-gain output 414 may be coupled to the third-stage transistor 432 (e.g., to a source of the transistor 432).

In some embodiments, a signal may be configured to travel from the second switch 424, through the transformer 405, through the first matching network 426, and/or to the low-gain output 416, as indicated by the signal path 440. To direct the signal along the signal path 440, the second switch 424, which may be associated with the high-gain output 414, may be biased to an ON state (e.g., 2.5V or 5V) and/or the first switch 422, which may be associated with the low-gain output 416, may be biased to an OFF state (e.g., 0V).

The second switch 424 may be configured to pull one side (e.g., the second node 412) of the second inductor 408 to ground. Moreover, the second switch 424 may be configured to isolate the inter-stage 430 network from the first matching network 426.

Figure 5:
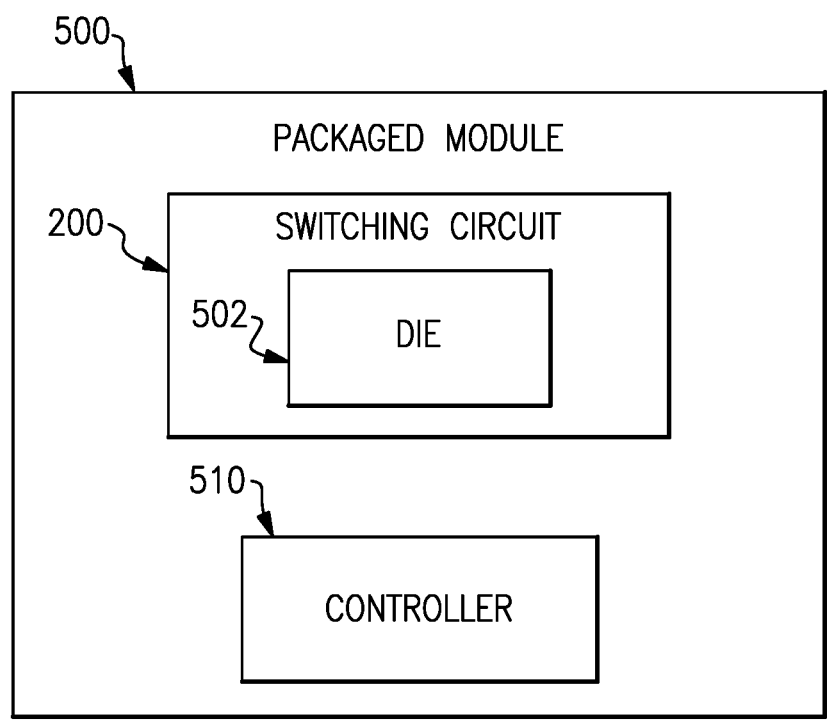
FIG. 5 illustrates an example packaged module having one or more features as described herein.

In the example of FIG. 5, the switching circuit 200 of FIG. 5 can be included in a packaged module 500. The switching circuit 200 can comprise a semiconductor die 502, which can include the various switches and/or coupling circuitry described herein with respect to FIG. 5 and/or other figures.

The packaged module 500 can further include a controller 510. Such a controller can be configured to provide, for example, the logic functionality as described herein to selectively bias the various switches of the switching circuit 200. In some embodiments, such a controller can be configured to operate with a control standard such as mobile industry processor interface (MIPI) standard.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 6:
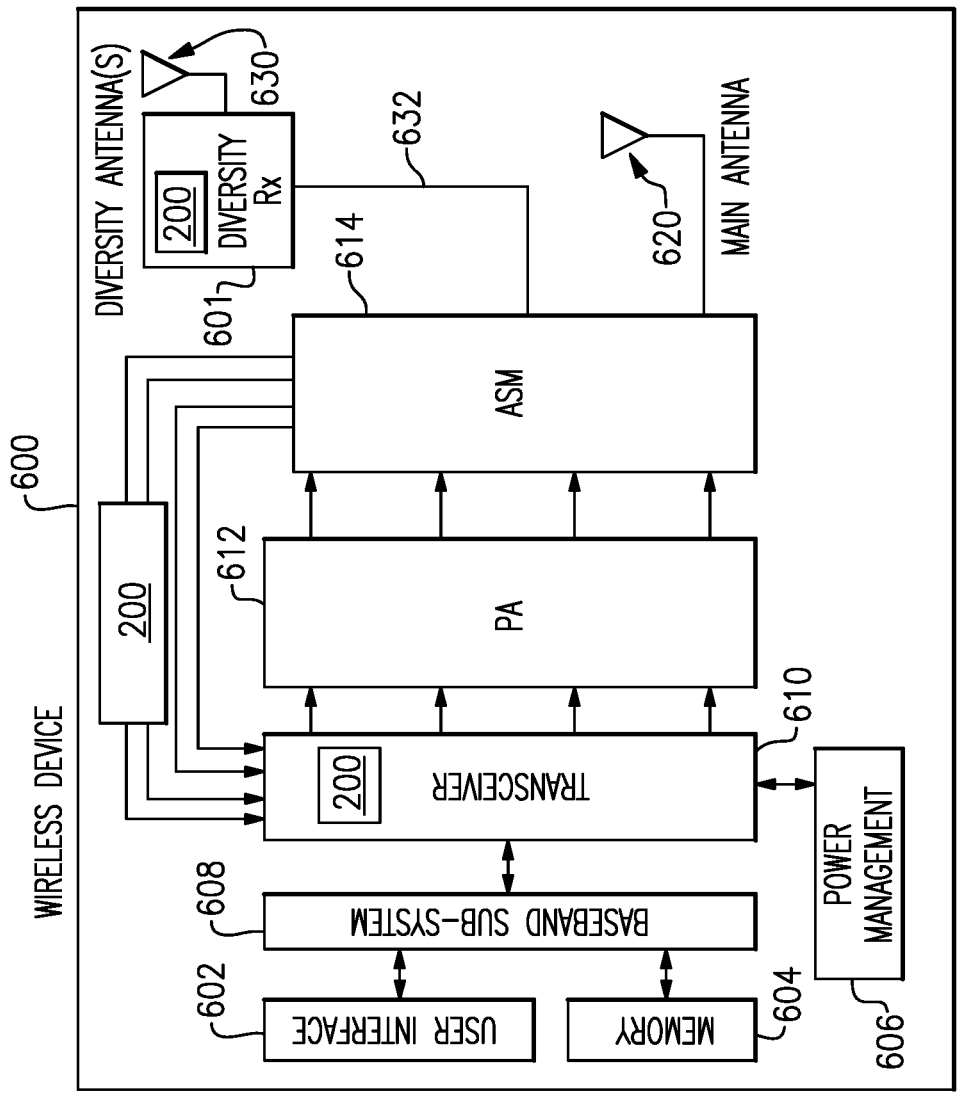
FIG. 6 depicts an example wireless device having one or more advantageous features described herein.

FIG. 6 depicts an example wireless device 600 having one or more advantageous features described herein. As described herein, one or more switching circuits having one or more features as described herein can be implemented in a number of places in such a wireless device. For example, in some embodiments, a switching circuit 200 having one or more features as described herein can be implemented in a module such as a diversity receive (DRx) module 601 having one or more low-noise amplifiers (LNAs).

In some embodiments, a switching circuit 200 having one or more features as described herein can be implemented in a transceiver. Such a switching circuit can be implemented as a separate module within the transceiver, or as a part of a transceiver module.

In some embodiments, a switching circuit 200 having one or more features as described herein can be implemented between a front-end module (e.g., DRx module) and a transceiver. Such a switching circuit 200 can be implemented as a separate module, as an assembly of circuit elements, or any combination thereof.

In the example of FIG. 6, power amplifiers (PAs) in a PA module 612 can receive their respective RF signals from a transceiver 610 that can be configured and operated to generate RF signals to be amplified and transmitted, and to process received signals. The transceiver 610 is shown to interact with a baseband sub-system 608 that is configured to provide conversion between data and/or voice signals suitable for a user and RF signals suitable for the transceiver 610. The transceiver 610 is also shown to be connected to a power management component 606 that is configured to manage power for the operation of the wireless device 600. Such power management can also control operations of the baseband sub-system 608 and other components of the wireless device 600.

The baseband sub-system 608 is shown to be connected to a user interface 602 to facilitate various input and output of voice and/or data provided to and received from the user. The baseband sub-system 608 can also be connected to a memory 604 that is configured to store data and/or instructions to facilitate the operation of the wireless device, and/or to provide storage of information for the user.

In the example of FIG. 6, the DRx module 601 can be implemented between one or more diversity antennas (e.g., diversity antenna 630) and the ASM 614 via coupling circuitry 632. Such a configuration can allow an RF signal received through the diversity antenna 630 to be processed (in some embodiments, including amplification by an LNA) with little or no loss of and/or little or no addition of noise to the RF signal from the diversity antenna 630. Such processed signal from the DRx module 601 can then be routed to the ASM through one or more signal paths.

In the example of FIG. 6, a main antenna 620 can be configured to, for example, facilitate transmission of RF signals from the PA module 612. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit comprising:
   a first transistor;
   a transformer including a first inductor and a second inductor that is co-centric with the first inductor;
   a first switch;
   a second switch;
   a second transistor;
   a first output;
   a second output; and
   a matching network coupled between the second output and the second transistor;
   the first inductor coupled to the first transistor, a first end of the second inductor, the first switch, and the first output together at a first node, a second end of the second inductor coupled to the second switch and the second transistor together at a second node, and the second output coupled to the second transistor.

2. The switching circuit of claim 1 wherein the first inductor is coupled to a collector of the first transistor.

3. The switching circuit of claim 1 wherein the first switch is a shunt switch.

4. The switching circuit of claim 1 wherein the second switch is a shunt switch.

5. The switching circuit of claim 1 further comprising a matching network, wherein the matching network is coupled between the first output and the first node.

6. The switching circuit of claim 1 wherein the matching network is coupled to a collector of the second transistor.

7. The switching circuit of claim 1 wherein the first transistor is a second-stage amplifier.

8. The switching circuit of claim 7 wherein the second transistor is a third-stage amplifier.

9. The switching circuit of claim 1 further comprising an inter-stage network, wherein the inter-stage network is coupled between the second transistor and the second node.

10. The switching circuit of claim 1 wherein the first switch is configured to be biased to an OFF state to direct a signal to the second output.

11. The switching circuit of claim 1 wherein the second switch is configured to be biased to an OFF state to direct a signal to the first output.

12. The switching circuit of claim 1 wherein the first output is a low-gain output.

13. The switching circuit of claim 1 wherein the second output is a high-gain output.

14. A semiconductor die comprising:
   a first transistor;
   a transformer comprising a first inductor and a second inductor that is co-centric with the first inductor;
   a first switch;
   a second switch;
   a second transistor;
   a first output;
   a second output; and
   a matching network coupled between the second output and the second transistor;
   the first inductor coupled to the first transistor, a first end of the second inductor, the first switch, and the first output together at a first node, a second end of the second inductor coupled to the second switch and the second transistor together at a second node, and the second output coupled to the second transistor.

15. The semiconductor die of claim 14 wherein the first inductor is coupled to a collector of the first transistor.

16. The semiconductor die of claim 14 further comprising a matching network, wherein the matching network is coupled between the first output and the first node.

17. A packaged module comprising:
   a first transistor;
   a transformer comprising a first inductor and a second inductor that is co-centric with the first inductor;
   a first switch;
   a second switch;
   a second transistor;
   a first output;
   a second output; and
   a matching network coupled between the second output and the second transistor;
   the first inductor coupled to the first transistor, a first end of the second inductor, the first switch, and the first output together at a first node, a second end of the second inductor coupled to the second switch and the second transistor together at a second node, and the second output coupled to the second transistor.

18. The packaged module of claim 17 further comprising a matching network, wherein the matching network is coupled between the first output and the first node.

* * * * *